(12) United States Patent
Cheruvu et al.

(10) Patent No.: US 8,790,791 B2
(45) Date of Patent: Jul. 29, 2014

(54) OXIDATION RESISTANT NANOCRYSTALLINE MCRAL(Y) COATINGS AND METHODS OF FORMING SUCH COATINGS

(75) Inventors: Narayana S. Cheruvu, San Antonio, TX (US); Ronghua Wei, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 167 days.

(21) Appl. No.: 12/760,864

(22) Filed: Apr. 15, 2010

(65) Prior Publication Data

US 2011/0256417 A1 Oct. 20, 2011

(51) Int. Cl.
| | | |
|---|---|---|
| *B32B 15/04* | (2006.01) | |
| *C23C 14/18* | (2006.01) | |
| *C23C 14/35* | (2006.01) | |
| *C23C 14/16* | (2006.01) | |
| *C22C 19/07* | (2006.01) | |
| *C22C 38/00* | (2006.01) | |
| *C22C 30/00* | (2006.01) | |
| *C22C 19/05* | (2006.01) | |
| *C23C 14/34* | (2006.01) | |

(52) U.S. Cl.
CPC ............... *C23C 14/165* (2013.01); *C22C 19/07* (2013.01); *C22C 38/00* (2013.01); *C23C 14/354* (2013.01); *C22C 30/00* (2013.01); *C22C 19/05* (2013.01); *C23C 14/345* (2013.01)
USPC ...................................... 428/627; 204/192.15

(58) Field of Classification Search
None
See application file for complete search history.

(56) References Cited

U.S. PATENT DOCUMENTS

| | | | | |
|---|---|---|---|---|
| 4,321,311 A | * | 3/1982 | Strangman | 428/623 |
| 4,419,416 A | * | 12/1983 | Gupta et al. | 428/656 |
| 4,585,481 A | * | 4/1986 | Gupta et al. | 106/14.05 |
| 4,588,490 A | | 5/1986 | Cuomo et al. | |
| 5,122,252 A | | 6/1992 | Latz et al. | |
| 5,178,739 A | | 1/1993 | Barnes et al. | |
| 5,308,806 A | | 5/1994 | Maloney et al. | |
| 5,309,874 A | | 5/1994 | Willermet et al. | |
| 5,346,600 A | | 9/1994 | Nieh et al. | |
| 5,499,905 A | * | 3/1996 | Schmitz et al. | 416/241 R |

(Continued)

FOREIGN PATENT DOCUMENTS

JP 2000326108 11/2000

OTHER PUBLICATIONS

US Office Action issued Aug. 29, 2011 issued in related U.S. Appl. No. 12/391,416.

(Continued)

*Primary Examiner* — Adam Krupicka
(74) *Attorney, Agent, or Firm* — Grossman Tucker et al

(57) ABSTRACT

The present disclosure relates to an oxidation resistant nanocrystalline coating and a method of forming an oxidation resistant nanocrystalline coating. An oxidation resistant coating comprising an MCrAl(Y) alloy may be deposited on a substrate, wherein M, includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium, is optionally present in the range of 0.1 wt % to 0.5 wt % of the MCrAl(Y) alloy. In addition, the coating may exhibit a grain size of 200 nm or less as deposited.

19 Claims, 15 Drawing Sheets

(56) References Cited

U.S. PATENT DOCUMENTS

| | | | |
|---|---|---|---|
| 5,683,825 A * | 11/1997 | Bruce et al. | 428/698 |
| 5,824,198 A | 10/1998 | Williams et al. | |
| 5,858,471 A | 1/1999 | Ray et al. | |
| 5,948,215 A | 9/1999 | Lantsman | |
| 6,054,188 A | 4/2000 | Tropsha et al. | |
| 6,087,025 A | 7/2000 | Dearnaley et al. | |
| 6,255,007 B1 | 7/2001 | dos Santos Pereira Ribeiro | |
| 6,444,036 B2 | 9/2002 | Chern et al. | |
| 6,455,167 B1 * | 9/2002 | Rigney et al. | 428/472.2 |
| 6,500,742 B1 | 12/2002 | Chern et al. | |
| 6,504,151 B1 | 1/2003 | Mitchell et al. | |
| 6,548,161 B1 | 4/2003 | Torigoe et al. | |
| 6,585,870 B1 | 7/2003 | Pitcher et al. | |
| 6,599,399 B2 | 7/2003 | Xu et al. | |
| 6,699,530 B2 | 3/2004 | Danek et al. | |
| 6,767,436 B2 | 7/2004 | Wei | |
| 6,896,773 B2 | 5/2005 | Chistyakov | |
| 6,896,775 B2 | 5/2005 | Chistyakov | |
| 6,923,885 B2 | 8/2005 | Masuda et al. | |
| 7,067,002 B2 | 6/2006 | Schmidt et al. | |
| 7,258,912 B2 | 8/2007 | Yamamoto et al. | |
| 7,361,386 B2 * | 4/2008 | Kim et al. | 427/456 |
| 2001/0025205 A1 | 9/2001 | Chern et al. | |
| 2002/0001976 A1 | 1/2002 | Danek et al. | |
| 2002/0032073 A1 | 3/2002 | Rogers et al. | |
| 2002/0132132 A1 | 9/2002 | Bose et al. | |
| 2002/0197502 A1 | 12/2002 | Zhao et al. | |
| 2003/0211736 A1 | 11/2003 | Ludviksson et al. | |
| 2004/0055870 A1 | 3/2004 | Wei | |
| 2004/0099215 A1 | 5/2004 | Danek et al. | |
| 2004/0144318 A1 | 7/2004 | Beck et al. | |
| 2004/0244653 A1 | 12/2004 | Schmidt et al. | |
| 2004/0259366 A1 | 12/2004 | Kim et al. | |
| 2005/0011748 A1 | 1/2005 | Beck et al. | |
| 2005/0079368 A1 * | 4/2005 | Gorman et al. | 428/469 |
| 2005/0170162 A1 | 8/2005 | Yamamoto et al. | |
| 2006/0147728 A1 | 7/2006 | Shen et al. | |
| 2006/0166019 A1 | 7/2006 | Spitsberg et al. | |
| 2007/0087185 A1 | 4/2007 | Wei et al. | |
| 2007/0284255 A1 | 12/2007 | Gorokhovsky et al. | |
| 2009/0214787 A1 | 8/2009 | Wei et al. | |
| 2010/0068556 A1 | 3/2010 | Lemmon et al. | |
| 2010/0104859 A1 | 4/2010 | Berczik et al. | |

OTHER PUBLICATIONS

Xiao et al, "Plasma-enhanced Deposition Of Hard Silicon Nitride-like Coatings From Hexamethyldisiloxane and Ammonia"; Elsevier Science B.V., Surface and Coatings Technology 172, 2003 (pp. 184-188).
US Office Action issued Mar. 31, 2011 issued in related U.S. Appl. No. 11/550,718.
Diserens et al. Surface and Coating Technology, 108-109, 1998,241-246.
Niederhoferet et al. Surface and Coating Technology, 120-121, 1999, 173-178.
U.S. Office Action dated Oct. 14, 2010 issued in related U.S. Appl. No. 11/550,718.
Chinese Office Action dated Dec. 27, 2010 issued in related Chinese Patent Application No. 200680035958.8.
US Office Action issued Jan. 25, 2012 issued in related U.S. Appl. No. 12/391,416.
Chinese Office Action issued Dec. 31, 2011 in related Chinese Application No. 200680035958.8.
US Office Action issued Jan. 3, 2013 issued in related U.S. Appl. No. 12/391,416.
European Search Report and Written Opinion of the Search Authority dated Nov. 12, 2012, issued in related European Application No. 06839460.0.
Diserens, et al "Improving The Properties Of Titanium Nitride by Incorporation Of Silicon"; Surface and Coatings Technology, Elsevier, Amsterdam, N, vol. 108-109; No. 1-3, Apr. 27, 1998, pp. 241-246.
US Office Action issued Jul. 30, 2013 issued in related U.S. Appl. No. 12/391,416 (18 pgs).
J.E. Krzanowski, et al "Mechanical Properties of Sputter-Deposited Titanium-Silicon-Carbon Films"; Journal of the American Ceramic Society, Mar. 2001, vol. 84, No. 3, pp. 672-674.
Anton et al., Thermal Cycling Testing of Thermal Barrier Coatings, Cyclic Oxidation of High Temperature Materials, Chapter 21, 1999, pp. 339-356.
Chan et al., Degradation Mechanism Characterization and Remaining Life Prediction for NiCoCrAlY Coatings, Proceedings of ASME Turbo Expo 2004, Power for Land, Sea, and Air, Jun. 14-17, 2004, pp. 1-8, Vienna, Austria.
Chen et al., Oxidation behavior of sputtered Ni-3Cr-20Al nanocrystalline coating, Materials Science and Engineering, 1999, pp. 360-365.
Chen et al., The Mechanism of Oxidation of Sputtered Ni-Cr-Al Nanocrystalline Coatings, Corrosion Reviews, 2000, pp. 195-204, vol. 18, Nos. 2-3.
Cheruvu et al., Cyclic Oxidation Behavior and Microstructure of Nanocrystalline Ni-20Cr-4Al Coating, Oxid Met, 2010, pp. 493-511, 73.
Cheruvu et al., Effect of Time and Temperature on Thermal Barrier Coating Failure Mode Under Oxidizing Environment, Journal of Engineering for Gas Turbines and Power, Mar. 2009, 7 pages, vol. 131.
Cheruvu et al., Evaluation, degradation and life assessment of coatings for land based combustion turbines, Energy Materials, 2006, pp. 33-47, vol. 1.
Cheruvu et al., In-service Degradation and Life Prediction of Coatings for Advanced Land-based Gas Turbine Buckets, JSME International Journal, 2003, pp. 635-641, Series A, vol. 46, No. 4.
Gao et al., Nano- and Microcrystal Coatings and Their High-Temperature Applications, Advanced Materials, Jul. 4, 2001, pp. 1001-1004, vol. 13, No. 12-13.
Geng et al., Hot-Corrosion Resistance of a Sputtered K38G Nanocrystalline Coating in Molten Sulfate at 900°C, Oxidation of Metals, Jun. 2002, pp. 549-557, vol. 57, Nos. 5/6.
Harvey, What is an MCrAlY coating?, http://www.twi.co.uk/content/faqmdfh005.html, downloaded from internet Mar. 24, 2010, 2 pages.
Hass, Thermal Barrier Coatings, Chapter 2, Directed Vapor Deposition of Thermal Barrier Coatings, 2000, Ph.D. Dissertation, University of Virginia, pp. 6-20.
Liu et al., Cyclic Oxidation of Sputter-Deposited Nanocrystalline Fe-Cr-Ni-Al Alloy Coatings, Oxidation of Metals, 1999, pp. 403-419, vol. 51, Nos. 5/6.
Liu et al., Improved Oxide Spallation Resistance of Microcrystalline Ni-Cr-Al Coatings, Oxidation of Metals, 1998, pp. 51-69, vol. 50, Nos. 1/2.
Liu et al., Oxidation behaviour of nanocrystalline Fe-Ni-Cr-Al alloy coatings, Material Science and Technology, Dec. 1999, pp. 1447-1450, vol. 15.
Liu et al., Oxidation Behaviour of Sputter-Deposited Ni-Cr-Al Micro-Crystalline Coatings, Elsevier Science Ltd., 1998, pp. 1691-1700, vol. 46, No. 5.
Liu et al., The Effect of Coating Grain Size on the Selective Oxidation Behaviour of Ni-Cr-Al Alloy, Elsevier Science Ltd, 1997, pp. 1551-1558, vol. 37, No. 10.
Merceron et al., Long Term Oxidation of FeCrAl ODS Alloys at High Temperature, Materials Science Forum, 2001, pp. 269-276, vols. 369-372.
Miller, Current Status of Thermal Barrier Coatings—An Overview, Surface and Coatings Technology, 1987, pp. 1-11, 30.
Movchan et al., Two- and three-layer coatings produced by deposition in vacuum for gas turbine blade protection, Surface and Coatings Technology, 1994, pp. 55-63, 67.
Padture et al., Thermal Barrier Coatings for Gas-Turbine Engine Applications, Science—Science's Compass—Review, Apr. 12, 2002, pp. 280-284, vol. 296.
Stiger et al., Mechanisms for the Failure of Electron Beam Physical Vapor Deposited Thermal Barrier Coatings Induced by High Temperature Oxidation, Elevated Temperature Coatings: Science and Technology III,The Minerals, Metals & Materials Society, 1999, pp. 51-65.

(56) References Cited

OTHER PUBLICATIONS

Uusitalo et al., High temperature corrosion of coatings and boiler steels in reducing chlorine-containing atmosphere, Surface and Coatings Technology, 2002, pp. 275-285, 161.

Vacuum Turbine Blade Coating—Electron Beam / Physical Vapor Deposition (EB/PVD) of Protective MCrAlY) and Thermal Barrier Coatings (TBC) The Solution ALD, http://web.ald-vt.de/cms/vakuum-technologie/anlagen/edpve/, downloaded from interned Mar. 24, 2010, 3 pages.

Wang, The Effect of Nanocrystallization on the Selective Oxidation and Adhesion of Al2O3 Scales, Oxidation of Metals, 1997, pp. 215-224, vol. 48, Nos. 3/4.

Wang et al., The Mechanism of Scale Adhesion on Sputtered Microcrystallized CoCrAl Films, Oxidation of Metals, 1996, pp. 39-50, vol. 45, Nos. 1/2.

Wei et al., Deposition of thick nitrides and carbonitrides for sand erosion protection, Surface & Coatings Technology, 2006, pp. 4453-4459, 201.

Wei, Plasma Enhanced Magnetron Sputter (PEMS) Deposition of Thick Nanocomposite Coatings for Erosion Protection, Chapter 6, Nanocomposite Coatings and Nanocomposite Materials, pp. 239-269.

Wei, Plasma enhanced magnetron sputter deposition of Ti-Si-C-N based nanocomposite coatings, Surface & Coatings Technology, 2008, pp. 538-544, 203.

Wei, Plasma enhanced magnetron sputtering deposition of superhard, nanocomposite coatings, Plasma Surface Engineering Research and its Practical Applications, 2008, pp. 87-111.

Wei, Solid Particle Erosion Protection of Turbine Blades with Thick Nitride and Carbonitride Coatings from Magnetron Sputter Deposition, Proceedings of the 5th International Surface Engineering Congress, May 15-17, 2006, pp. 78-84.

Wright et al., Influence of Aluminum Depletion Effects on the Calculation of the Oxidation Lifetimes of FeCrAl Alloys, Materials Science Forum, 2004, pp. 579-590, vols. 461-464.

Zhang et al., Hot Corrosion of an Electrodeposited Ni-11 wt % Cr Nanocomposite under Molten Na2SO4-K2SO4-NaCl, Journal of the Electrochemical Society, 2005, pp. B321-B326.

International Search Report and Written Opinion issued in related International Patent Application No. PCT/US06/60053 dated Sep. 25, 2007.

Poire, "Micro Photonics Inc.," Analytical Report NHT-020802, Method: Nano Hardness Tester. Sample(s) Optical Fiber w/connector. Customer: Megladon Manufacturing Gp., Date: Aug. 2, 2002. 8 pages.

Seal, "Transition Metal Nitride Functional Coatings," JOM; Functional Coatings Overview. Dated: Sep. 2001. 1 page.

Swann, "Magnetron Sputtering," Phys. Technol. 19. Dated 1988. 9 pages. IOP Publishing Ltd. Printed in the UK.

Science Lab.com, "Material Safety Data Sheet, Hexamethyldisiloxane MSDS," available at http://www.sciencelab.com/xMSDS-Hexamethyldisiloxane-9924249, retrieved on May 1, 2009. 6 pages.

Jbaker.com, "Hexamethyldisilozane," available at www.jbaker.com/msds/englishhtml/h2066.htm; retrieved on Feb. 5, 2009. 5 pages.

Ding et al., Mechanical properties and wear resistance of multilayer thin coatings on cutting tools, Journal of Tribology, vol. 20, No. 3, pp. 170-174 Jun. 30, 2000.

Oliver, et al., "An improved technique for determining hardness and elastic modulus using load and displacement sensing indentation experiments," J. Mater. Res., vol. 7, No. 6, Jun. 1992, pp. 1564-1583.

ASTM International, "Standard Test Method for Conducting Erosion Tests by Solid Particle Impingement Using Gas Jets," Designation G76-07.

Chinese Office Action dated Jan. 29, 2010 issued in relation Chinese Patent Application No. 200680035958.8.

Chinese Office Action dated Sep. 2, 2010 issued in relation Chinese Patent Application No. 200680035958.8.

* cited by examiner

US 8,790,791 B2

OXIDATION RESISTANT NANOCRYSTALLINE MCRAL(Y) COATINGS AND METHODS OF FORMING SUCH COATINGS

STATEMENT REGARDING FEDERALLY SPONSORED RESEARCH OR DEVELOPMENT

This invention was made with U.S. Government support under Contract No. DE-FC26-07NT43096 awarded by the Department of Energy. The Government has certain rights in this invention.

FIELD OF THE INVENTION

The present disclosure relates to oxidation resistant nanocrystalline MCrAl(Y) coatings and methods of forming such coatings.

BACKGROUND

Several components such as those used in land-based and aero gas turbines, steam turbine boilers, and chemical processing equipment operate in severe oxidizing and hot corrosion environments. These components may operate in frequent on-off mode. As a result the components may be exposed to high temperatures and experience thermal cycling between the operating temperatures (relatively high temperatures) and room temperature, which may result in relatively high thermal stresses in the coating and the protective oxide scale.

MCrAl(Y) coatings have been applied to these components via low pressure plasma spray, plasma vacuum spray or high velocity oxy flame processes. Upon exposure to high temperature environments (700° C. to 1200° C.) the aluminum present in the coating proximate to the outer surface reacts with oxygen in the environment, forming an $Al_2O_3$ oxide layer, which protects the component from further oxidation. However, during thermal cycling, the high thermal stresses may cause spallation of the $Al_2O_3$ coating, which may be accelerated by the presence and formation of mixed oxides including NiO, $Cr_2O_3$ and spinels that may form with the $Al_2O_3$. As spallation occurs, aluminum in the coating may diffuse towards the surface to replenish the $Al_2O_3$ coating. It may be appreciated that the aluminum may diffuse not only towards the surface of the coating, but also into the substrate. Thus, the coating service life may be dependent upon the amount of aluminum present and the potential rate of aluminum consumption.

SUMMARY OF THE INVENTION

An aspect of the present disclosure relates to a method of forming an oxidation resistant nanocrystalline coating. The method may include depositing an oxidation resistant coating comprising an MCrAl(Y) alloy on a substrate, wherein M, includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium, is optionally present in the range of 0.1 wt % to 0.5 wt % of the MCrAl(Y) alloy. In addition, the coating may exhibit a grain size of 200 nm or less as deposited.

In a further aspect, the coating may include a surface and exhibit a usable aluminum content ($Al_{usable}$) for diffusing into the substrate or to the coating surface, wherein the usable aluminum content may be equal to 5.5 wt % to 11.5 wt %. In yet a further aspect, the coating may exhibit an overall increase in weight of 0.000 grams/cm² to 0.0010 grams/cm² over an initial weight value when thermally cycled to peak temperatures of 1010° C. for 50 minutes per cycle and cooled to room temperature in 10 minutes per cycle over 1500 cycles.

Another aspect of the present disclosure relates to an oxidation resistant nanocrystalline coating. The coating may include an MCrAl(Y) alloy, wherein M, includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium, is optionally present in the range of 0.1 wt % to 0.5 wt % of the MCrAl(Y) alloy. The coating may exhibit a grain size of 200 nm or less as deposited on a substrate.

BRIEF DESCRIPTION OF THE DRAWINGS

The above-mentioned and other features of this disclosure, and the manner of attaining them, will become more apparent and better understood by reference to the following description of embodiments described herein taken in conjunction with the accompanying drawings, wherein.

DETAILED DESCRIPTION

Figure 1:
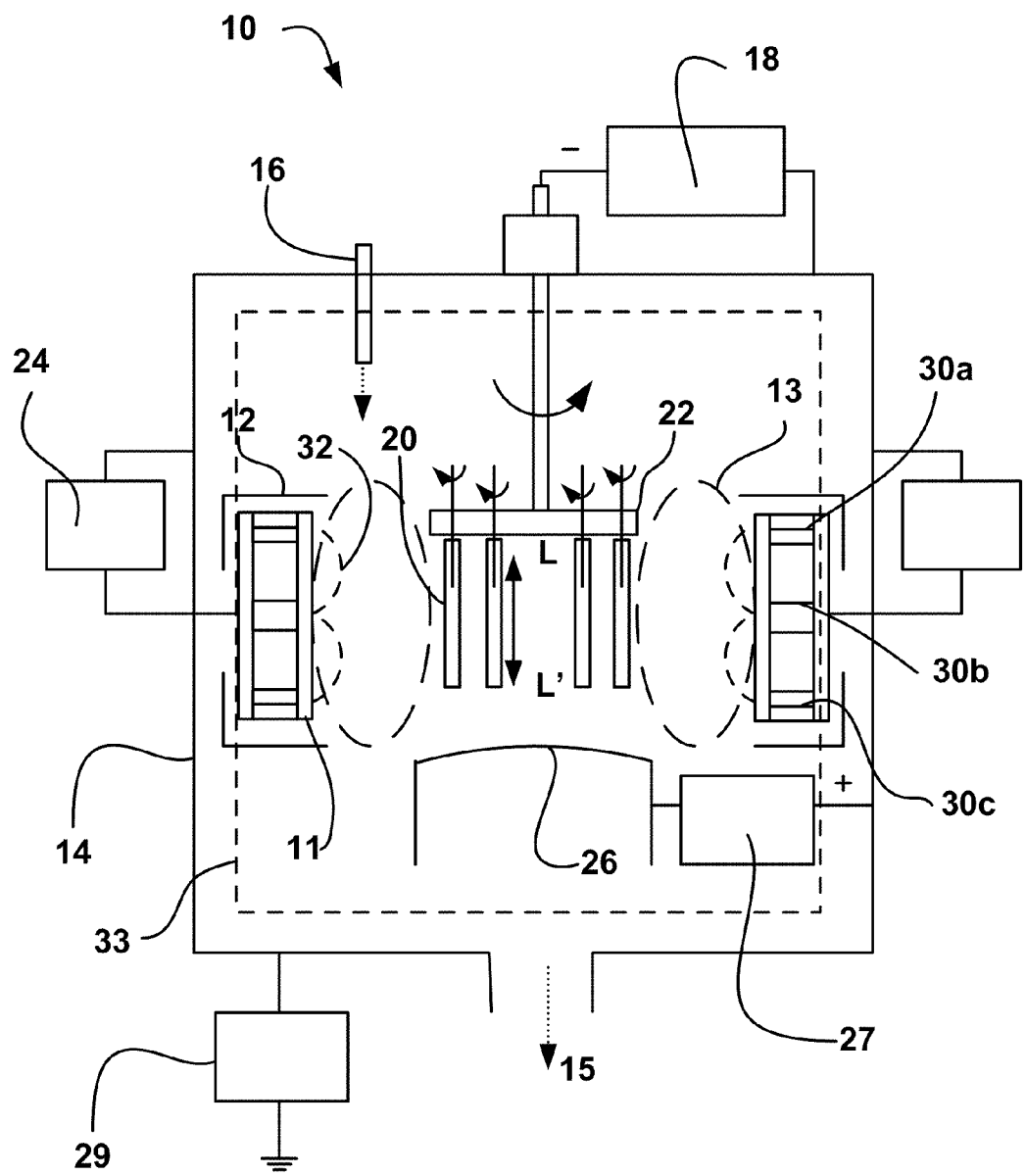
FIG. 1 illustrates a schematic of one embodiment of a plasma enhanced magnetron sputtering system.

The present disclosure relates to oxidation resistant nanocrystalline MCrAl(Y) coatings and a method of providing such coatings. An oxidation resistant coating may be understood as a coating that may reduce or inhibit oxidation of a substrate composition. An oxidation resistant coating may provide an oxide scale over a surface of the coating opposite the substrate, which may prevent additional oxidation from occurring in the substrate and/or internal oxidation in the oxidation resistant coating. Nanocrystalline coatings herein may be understood as reference to deposited coatings exhibiting a grain size of 200 nm or less, including all values and increments in the range of 1 nm to 200 nm. Grain size is reference to regions of atomic regularity, and at the grain boundaries, the metal atoms appear misaligned. The oxidation resistant coatings may be used for components that may be exposed to relatively high temperatures, such as in the range of 700° C. to 1200° C., including all values and increments therein, and/or for components that may be exposed to thermal cycling between relatively high temperatures and room temperature. An optional diffusion barrier layer may be employed between the oxidation resistant nanocrystalline MCrAl(Y) alloy coating and the substrate, which may prevent aluminum diffusion into the substrate.

The oxidation resistant nanocrystalline MCrAl(Y) coatings may be applied to a number of substrates. The substrates may include, for example, turbine components, boiler components, or chemical processing components, as well as other components that may be exposed to relatively high temperatures and/or thermal cycling. Non-limiting examples of substrate base materials may include, iron based compositions such as stainless steel, nickel based compositions such as HAYNES 230, cobalt based compositions, or copper based compositions.

The nanocrystalline MCrAl(Y) alloys may include a base material, M, which may be iron, nickel, cobalt, or combinations thereof. M may be present at a weight percent of the total alloy composition (wt. %) of greater than 50%, such as in the range of 50 wt % to 80 wt %, including all values and increments therein. In some non-limiting examples, M may be present in the range of 55 wt. % to 79 wt. %. Cr, chromium, may be present in the range of 15 wt % to 30 wt %, including all values and increments therein. Al, aluminum, may be present in the range of 6 wt % to 12 wt %, including all values and increments therein. In addition, Y, yttrium, may optionally be present in the range of 0.1 wt % to 0.5 wt %, including all values and increments therein, and therefore when not present, the wt % of yttrium may be 0.0. The MCrAl(Y) alloy compositions may also, optionally, include other elements. For example, Si, silicon may also be optionally present in the range of 0.1 wt % to 1.0 wt %, including all values and increments therein, and therefore, when not present, the wt % of silicon may be 0.0. In addition, Hf, hafnium may optionally be present in the range of 0.1 wt % to 1.0 wt %, including all values and increments therein, and therefore, when not present, the wt % of hafnium may be 0.0.

In some non-limiting embodiments, the nanocrystalline MCrAl(Y) compositions may include NiCrAl alloys, wherein chromium may be present in the range of 15 wt % to 25 wt %, aluminum may be present in the range of 6.0 wt % to 12.0 wt %, yttrium may optionally be present in the range of 0.1 wt % to 0.5 wt %, silicon may optionally be present in the range of 0.1 wt % to 1.0 wt % and hafnium may optionally be present in the range of 0.01 wt % to 1.0 wt %, wherein the balance may be nickel. In other non-limiting embodiments, the MCrAl(Y) compositions may include NiCoCrAl alloys, wherein cobalt may be present in the range of 20.0 wt % to 40.0 wt %, chromium may be present in the range of 15 wt % to 25 wt %, aluminum may be present in the range of 6.0 wt % to 12.0 wt %, yttrium may optionally be present in the range of 0.1 wt % to 0.5 wt %, silicon may optionally be present in the range of 0.1 wt % to 1.0 wt % and hafnium may optionally be present in the range of 0.01 wt % to 1.0 wt %, wherein the balance may be nickel. In further non-limiting embodiments, the nanocrystalline MCrAl(Y) compositions may include CoCrAl alloys, wherein chromium may be present in the range of 20 wt % to 30 wt %, aluminum may be present in the range of 6.0 wt % to 12.0 wt %, yttrium may optionally be present in the range of 0.1 wt % to 0.5 wt %, silicon may optionally be present in the range of 0.1 wt % to 1.0 wt % and hafnium may optionally be present in the range of 0.01 wt % to 1.0 wt %, wherein the balance may be cobalt. It may be appreciated that the above elemental components may be present at all values and increments in the above recited ranges, at 0.01 wt % increments.

In some embodiments, the coatings may consist of or consist essentially of the nanocrystalline MCrAl(Y) alloys contemplated herein and in other embodiments the coatings may also include a diffusion barrier interlayer disposed between at least a portion of the nanocrystalline MCrAl(Y) coatings and the substrate. Diffusion barrier interlayers may include nitride compositions, carbide compositions, oxide compositions and/or combinations thereof. The diffusion barrier compositions may therefore include, for example, transition metals and/or metalloids in combination with nitrogen, carbon or oxygen, to provide the a nitride, carbide or oxide composition. Examples of transition metals and metalloids include Ti, Zr, Ta, W, Al, Si, etc. It may be appreciated that examples of barrier layer compositions may include TiN, ZrN, TaN, WN, AlN, Ti—Si—N, Zr—Si—N, Ta—Si—N, Ti—Si—C—N, $Al_2O_3$, etc.

The oxidation resistant nanocrystalline MCrAl(Y) coatings may be deposited at a thickness in the range of 10 μm to 50 μm, including all values and increments therein. Furthermore, the coating microstructure may include a M-rich solid solution, such as Fe, Ni or Co. A M-rich solid solution may be understood as that situation where the particular metal (M) is a single phase present as a relatively continuous phase, or a solid solution-single phase of all the elements. For example, where Ni is present the Ni-rich solid solution may exhibit a γ-phase microstructure. In some embodiments and as alluded to above, the grain size of the MCrAl(Y) coatings as deposited may be less than 200 nm, such as in the range of 5 nm to 20 nm, including all values and increments therein, depending on the amount of the various elemental constituents present in the alloy, such as for example, the amount of aluminum. In some embodiments, the grain size of the deposited coating may be determined using the width of the most intense M-rich phase peak in an XRD pattern.

Upon thermal cycling, the nanocrystalline coatings may exhibit an initial increase in weight, but overall the coatings may exhibit relatively little weight loss. Tests demonstrating coating behavior upon thermal cycling may be performed, in some embodiments, in a bottom drop furnace or other heating apparatus at a peak temperature of 1010° C., where the substrate is held at that temperature for 50 minutes and then forced air cooled for 10 minutes to room temperature for 1500 cycles. It is noted that the weight of the oxidation resistant coating deposited over a substrate may initially increase in the range of 0.0020 grams/cm$^2$ or less over the course of the first 300 cycles to 400 cycles, but then drop such that the weight may exhibit an overall increase of 0.000 grams/cm$^2$ to 0.0010 gram/cm$^2$ over an initial weight value. Furthermore, a net weight loss may not be exhibited by the coating when thermally cycled for 1500 cycles at the peak temperature of 1010° C., thus the overall net weight loss may be 0.000 grams/cm$^2$. However, it may be appreciated that temperatures in the range of 500° C. to 1010° C. may be utilized in testing oxidation behavior of the coatings, depending on the service environment of the coatings. Furthermore, it may be appreciated that holding times and cooling temperatures may vary depending on the service environment for which the components are intended. For example, holding times for peak hold temperatures may be in the range of 10 minutes to 10 hours, including all values and increments therein, and cooling times may be in the range of 2 minutes to 2 hours, including all values and increments therein.

After thermal cycling at peak temperatures of 1010° C. for 50 minutes and 10 minutes of forced air cooling to room temperature, the aluminum content in the coating itself may drop from initial levels as deposited of 6 wt % to 12 wt % to levels of 0.5 wt %. No internal oxidation or relatively low amounts of internal oxidation may be present, such as in the range of 0.1 wt % to 0.5 wt % of oxides within the coating boundaries. It is also noted that the nanocrystalline coatings may include a dense $Al_2O_3$ oxide scale on at least a portion of the external surfaces, i.e., surfaces of the coating opposite the substrate, particularly after thermal cycling. The scale may include or consist entirely of $Al_2O_3$, wherein the $Al_2O_3$ may be present at levels of greater than 90 wt % in the oxide scale, including all values and increments in the range of 90 wt % to 99.9 wt % in the oxide scale. Accordingly, mixed oxides such as NiO, $Cr_2O_3$ and/or spinels may not be present, or present at relatively low amounts in the $Al_2O_3$ scale, such as in the range of 0.1 wt % to 10 wt %.

One or more layers of the MCrAl(Y) coating may be deposited. Where more than one layer is contemplated, the individual coating layers may be different or alternated. In addition, one or more layers of a diffusion barrier coating may be present between the MCrAl(Y) alloy and the substrate or between layers of the MCrAl(Y) alloy. It is noted that, in some non-limiting embodiments, the nanocrystalline MCrAl (Y) coatings may be applied under a thermal barrier coating, that is, the nanocrystalline MCrAl(Y) coatings may be applied between a substrate and a thermal barrier coating. A non-limiting example of thermal barrier coatings may include yttria-stabilized zirconia; however, it is contemplated that other thermal barrier coatings may be utilized as well.

The coatings may be applied via a physical vapor deposition process, such as magnetron sputter deposition, electron beam evaporation and cathodic arc deposition. Other application techniques may include thermal and/or plasma spray techniques such as atmospheric or air plasma spray, low pressure plasma spray, vacuum plasma spray, spray high velocity oxy flame, wire arch spray, etc. In one embodiment, the coatings may be applied via plasma enhanced magnetron sputtering, which is described in U.S. patent application Ser. No. 11/550,718, filed on Oct. 18, 2006, and U.S. patent application Ser. No. 12/391,416, filed Feb. 24, 2009, the teachings of which are incorporated by reference herein.

An embodiment of plasma enhanced magnetron sputtering is illustrated in FIG. 1. The magnetron sputtering system 10 may include one or more magnetrons 12, each supporting a sputter material target 11, in a vacuum chamber 14 having a gas port 16 and a pump 15 in fluid communication with the vacuum chamber 14. The gas port 16 may be supplied by precursor supply system, described below, as well as by an inert gas feed.

The magnetron sputtering system may include an electron source 26, such as a filament, which may discharge electrons into the system when heated to thermionic emission temperature. Examples of filaments may include tungsten or tantalum. Electron sources may also include, for example, hollow cathode(s), RF antenna(s) and microwave generator(s). The magnetron sputtering system 10 may provide an energy source 24 for negatively biasing the magnetron 12, an energy source 18 for negatively biasing the surface of the workpieces 20, and an energy source 27 for negatively biasing the electron source, as well as, in some embodiments, an energy source 29 for positively biasing the chamber wall 14. The energy source may be a voltage source and may be associated with circuitry. The energy sources may provide radio frequency (RF) or native voltage in the form of DC power or pulse DC power. Where DC power or pulse DC power may be contemplated, a voltage control may be activated to negatively bias the respective component.

The magnetron 12 may assume any structure or geometry that may be effective to produce a substantially uniform magnetron generated plasma 13 along the length L-L' of the substrates or workpieces 20. For example, the magnetron may be a planar magnetron, which may be understood as a magnetron that may include one or more permanent magnets aligned adjacent to one another with oppositely orientated poles. The ends of the magnets 30a and 30c may be the north pole of the respective magnet and the end of the adjacent magnet 30b may be the south pole or vice versa. The magnets generate north to south magnetic fields 32, which may be along the length of the sputter target material 11. The magnets may generally produce a magnetic field of 500 Gauss or more, including 1,000 Gauss or more.

The ion current density generated by the magnetron 12 may be relatively uniform along the length of the sputter target material 11. The ion current density generally may be from 0.01 mA/cm$^2$ to 500 mA/cm$^2$, including all values and increments therein, such as 20 mA/cm$^2$. The rate of decay of the sputter target material 11 and the amount of metal atoms deposited onto the surface of the workpieces 20 may be substantially uniform along the length of (L-L') of the workpieces 20.

In one example of a process for forming a coating, the magnetron sputtering system 10 may be evacuated via a pump 15 to a pressure of $10^{-6}$ to $10^{-5}$ torr, including all values and increments therein. An inert gas, which may be understood as a gas that may not be reactive with other compositions may be fed through port 16 and into the vacuum chamber 14. Examples of inert gas may include, but are not limited to, argon, krypton, xenon, etc. Suitable feed rates for each gas delivered may be in the range of 1 to 200 standard cubic centimeters per second (sccm), including all values and increments therein, such as 5 to 50 sccm. The gas may be injected at a pressure of 1 to 10 millitorr including all values and increments therein, and may be continuously fed into the chamber through the duration of the process.

As noted above, the workpiece (or substrate) may be sputter cleaned. The inert gas supplied in the system 10 may be ionized by negatively biasing the electron source. Biasing the electron source may cause electrons to drawn to the vacuum chamber walls, causing collisions with the inert gas, separating the gas into ions and electrons. The ions may be drawn to the negatively charged worktable and thus accelerated towards the workpiece at 50 to 300 eV, including all values and increments therein, to remove surface oxide and/or contaminants. Sputter cleaning may occur for 10 to 200 minutes, including all values and increments therein, such as for 90 minutes.

The magnetron 12 may then be negatively biased at 2 kW or more, such as in the range of 0.05 kW to 10 kW, including all values and increments therein, such as 4 kW to 10 kW, etc., via the energy source 24. The biasing of the magnetron may form a magnetron plasma 13, which may be understood as electrons and gas ions of the inert gas, or other gasses that may be present in the sputtering system 10. Ions from the magnetron plasma 13 may be accelerated toward the sputter target material 11 with sufficient energy to remove or sputter atoms from the target material 11. The sputtered metal atoms may be deposited onto the surface of the negatively biased workpieces 20 to form a substantially uniform metallic coating having a desired thickness. As used herein, the phrase "substantially uniform coating" may be understood as the surface of the workpieces being covered by a coating of a given thickness. The coating may exhibit a uniformity of thickness of +/−20% or less of the given coating thickness along its length.

As alluded to above, the magnetron sputtering system may include one or more targets. For example, in one embodiment, the sputtered targets may include MCrAl(Y) or the sputtered targets may include, for example, one target including M-Cr and one target including Al and/or other compositions. In other embodiments, one target may include M, one target including Cr, one target including Al, and one target including other compositions, etc.

The worktable 22, and thereby the workpieces 20, may be negatively biased at 20 V or more, e.g. up to 200 V, including all values and increments between 20V and 200V therein, such as 200V, 40V, etc., via the energy source 18. The bias of the worktable may draw ions towards the workpiece, which may aide in the densification of the coating. The electron source 26 may also be negatively biased at 50 V or more, e.g. up to 200 V, including all values and increments in the range of 50 V to 200 V, such as 75 V, 120 V, etc., via the energy source 27. The electron source 26 and the discharge power supply 27 together may generate global plasma in the vacuum system 14, from which a discharge current of 0.5 A or more, e.g. up to 20 A, including all values and increments in the range of 0.5 A and 20 A, such as 10 A, may be drawn as read at the energy source 27.

One or more diffusion barrier layers may be applied to the substrate prior to applying the MCrAl(Y) coating and the substrate via the plasma enhanced magnetron sputtering described above. In some embodiments, a reactive gas may be provided in the chamber through the gas port 16 to form the diffusion barrier layer, which may include a metal compound that may or may not be dispersed in a ceramic matrix prior to or during sputtering. The reactive gas may include one or more precursors, such as nitrogen, methane, acetylene, oxygen, silicon, ammonia or combinations thereof as well as silanes, siloxanes, silazanes and combinations thereof.

Figure 2:
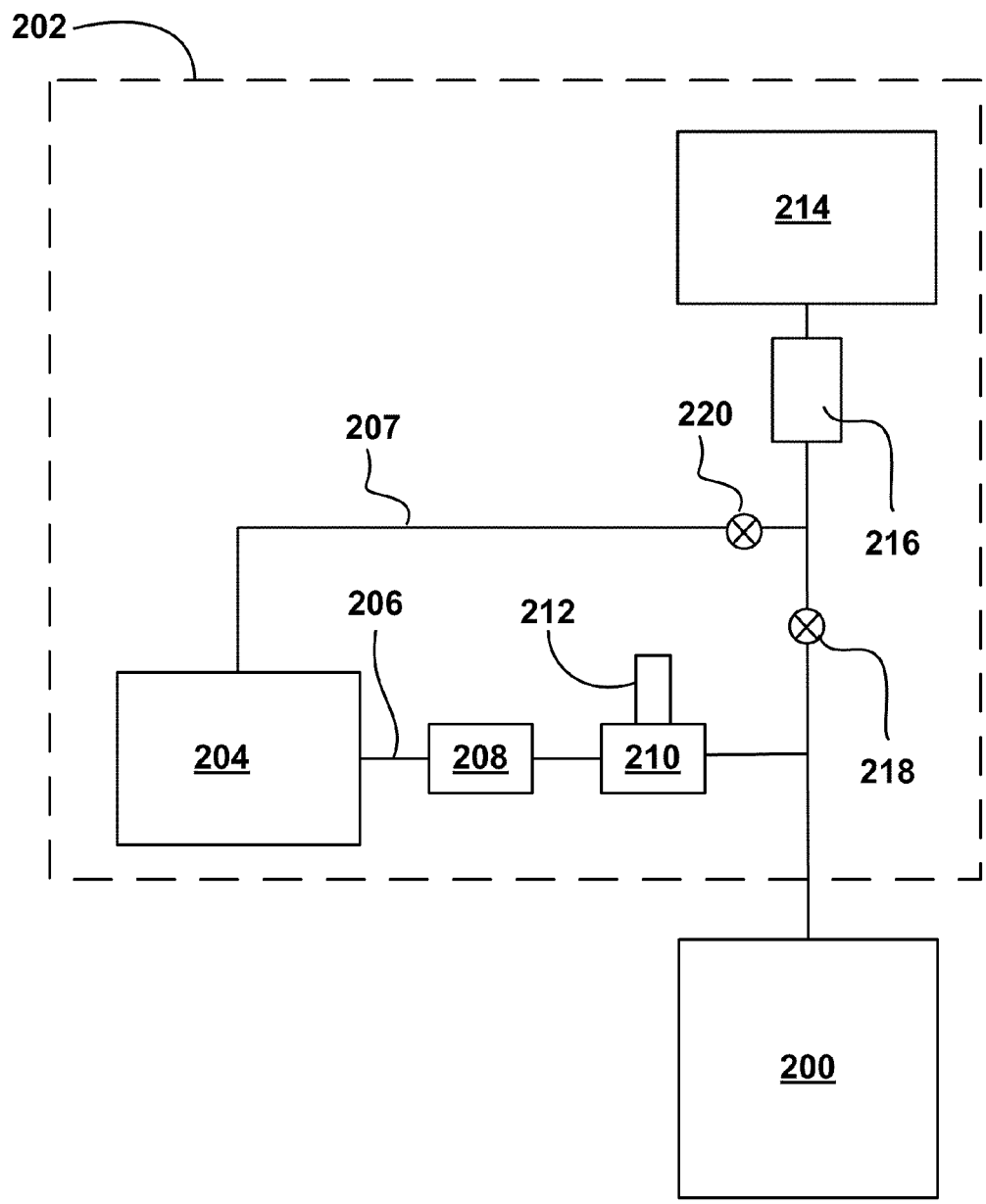
FIG. 2 illustrates a schematic of one embodiment of a gas supply system.

The reactive gas may be provided to the process chamber 200 via a precursor supply system 202, an example of which is illustrated in FIG. 2. The precursors may be loaded into a container or vessel 204. The container may be in fluid communication with the process chamber by, for example, tubings 206. A mass flow controller 208 may be placed between the container and the process chamber to measure and/or control the flow of the precursors. In addition, a purging system 210 and process may be used to remove air from the precursor supply system. For example, in one embodiment, a vacuum port 212 may be provided to apply vacuum to the precursor supply system. The system, including the precursor container, the mass flow controller and/or tubings, may be heated to a temperature in the range of 27° C. to 60° C., including all values and increments therein, such as 30° C. to 50° C. It may be appreciated that the inert gas supply 214 may tie into the precursor system or may operate separately from the precursor supply system. In such a manner, the inert gas supply 214 may also incorporate a mass flow controller 216 to measure and/or control the flow of the precursors as well as valve 218 to control the flow of the inert gas. In addition, the inert gas from the inert gas supply 214 may be used to carry the reactive gas from the reactive gas/precursor container 204 to the process chamber 200. The inert gas supply may communicate and/or be regulated through valve 220 and tubings 207 to the precursor container 204.

The reactive gas may be provided at a flow rate in the range of 0.1 to 200 standard cubic centimeters per minute (sccm). It may be appreciated that one or more gas precursors may be provided having a flow rate in the range of 0.1 to 100 sccm, including all values and increments therein. Furthermore, as noted above, a number of coatings may be deposited, wherein some of the coating layers may utilize a reactive gas and some of the coating layers do not. The reactive gas flow may again be controlled by, for example, the mass flow controller in such situations. Furthermore, the reactive gas may be mixed with the inert gas during delivery of the gasses to the vacuum chamber, forming a mixed gas.

Once again, the electron source 26 may inject electrons into the vacuum chamber 14. The discharge power supply, the energy source 27, may draw injected electrons to the walls of the vacuum chamber 14 and the electrons may collide with atoms of the gas as they are drawn towards the walls. The high energy collisions may cause ionization and production of "electron generated global plasma" 33 in substantially the entire vacuum chamber by providing the energy source 18. As a result, a number of ions may bombard the surface of the workpieces 20 which are being deposited with atoms, producing the protective coating including the reaction product of the metal atoms and the reactive gas. The electron discharge conditions may be effective to induce the reactive gas to react with the metal atoms to form the desired coating. The electron discharge conditions may induce the deposition temperature of the workpieces 20 to 200° C. or higher, e.g. up to 500° C., including all values in the range of 200° C. and 500° C. and increments therein.

As noted above, the discharge current of the electron source may be independently controllable, which may allow for increasing the ion-to-atom ratio. The "ion-to-atom ratio" may be defined as the ratio of each arriving ion to the number of metal atoms present at the surface of the substrates or workpieces. The required ion-to-atom ratio may vary according to the mass and energy of the ion species. In some examples, the ion-to-atom ratio may be at least 0.01 ions for every metal atom present at the surface of the substrates or workpieces.

The deposition process of the optional diffusion barrier layers or the MCrAl(Y) coatings may be continued for a period of time sufficient to form a substantially uniform protective coating having a desired thickness. Again, the oxidation resistant coating thickness may be 10 μm (micrometers) or more, including all values and increments in the range of 10 μm to 50 μm, including all values and increments therein, such as 25 μm to 35 μm, as measured by scanning electron microscope (SEM) calibrated using National Institute of Standards and Technology (NIST) traceable standards. The coating thickness may also be measured by other suitable methods, for example, stylus profilometer measurement. The deposition time period required to achieve such thicknesses may generally be 3 hours to 7 hours, including all values and increments therein, such as 4 hours to 6 hours.

Upon completion, the coated workpieces 20 may be removed from the vacuum chamber 14. The properties of the protective coatings may be evaluated and/or described by a number of procedures, such as by oxidation or thermal cycling tests and various hardness quantifiers.

EXAMPLES

The following examples are for the purposes of illustration and are not meant to limit the scope and depth of the disclosure or claims appended herein.

Two MCrAl(Y) coatings were prepared via plasma enhanced magnetron sputtering including Ni-20Cr-7Al and Ni-20Cr-10Al. To prepare these coatings a Ni-20Cr target and an Al target were utilized during deposition. Power provided to the Ni-20Cr target was maintained at 4 kW, while power to the Al target was varied from 0.7 kW to 1.1 kW to change the weight percentage of the Al in the deposited coating. When analyzed by EDS, the Ni-20Cr target included 79.96 wt. % Ni and 20.04 wt. % Cr and the Al target including 99.99 wt Al. The coatings were deposited on Haynes 230 substrates. The nominal composition of Haynes 230 was 57 wt %. nickel, 22 wt % chromium, 14 wt % tungsten, 2 wt % molybdenum, 3 wt % iron, 5 wt % cobalt, 0.5 wt % manganese, 0.4 wt % silicon and 0.3 wt % aluminum.

Figure 3A:
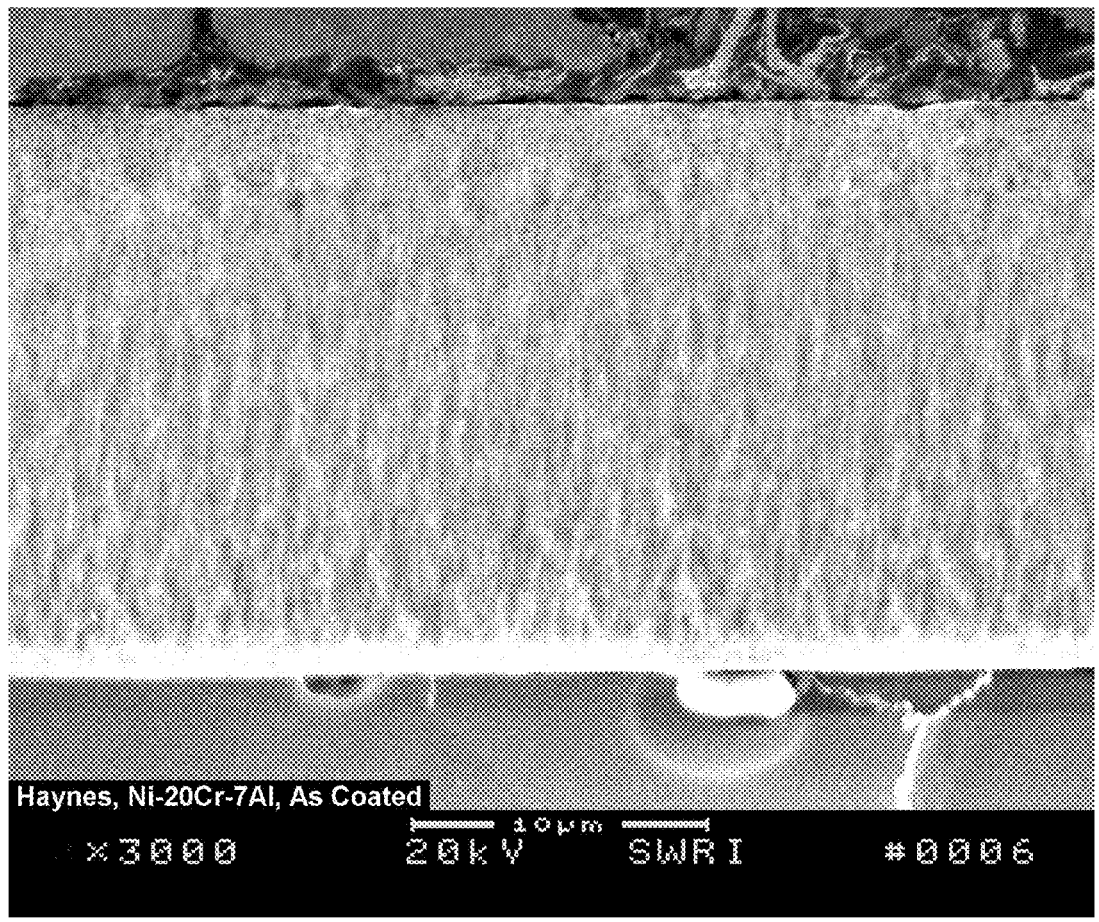
FIG. 3a illustrates an optical micrograph of an example of a nanocrystalline Ni-20Cr-7Al coating, wherein the scale at the bottom indicates 10 μm.
Figure 3B:
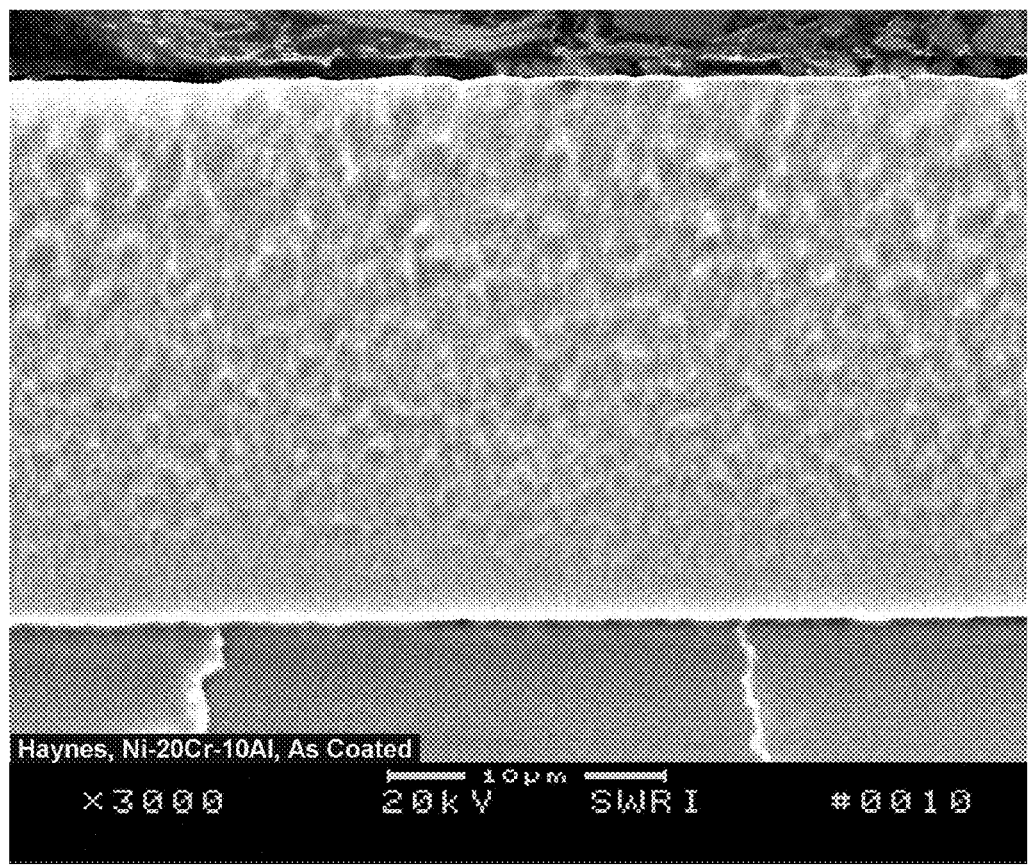
FIG. 3b illustrates an optical micrograph of an example of a nanocrystalline Ni-20Cr-10Al coating, wherein the scale at the bottom indicates 10 μm.

Cross-sections of the as-deposited coatings are illustrated in FIGS. 3a and 3b, wherein FIG. 3a illustrates the Ni-20Cr-7Al coating and FIG. 3b illustrates the Ni-20Cr-10Al coating. The average coating thickness of the samples were 19.8 μm for the Ni-20Cr-7Al coating and 20.7 μm for the Ni-20Cr-10Al coating. EDS analysis performed on the coatings provided the chemical compositions illustrated in Table 1.

TABLE 1

Chemical Composition of Ni—20Cr—7Al and Ni—20Cr—10Al coatings.

| Element | Ni—20Cr—7Al (KT 2-11) (wt %) | Ni—20Cr—10Al (KT 2-12) (wt %) |
|---|---|---|
| Aluminum | 7.51 | 10.56 |
| Chromium | 20.01 | 19.38 |
| Iron | 0.23 | 0.22 |
| Tungsten | 0.40 | 0.35 |
| Nickel | Balance | Balance |

Figure 4A:
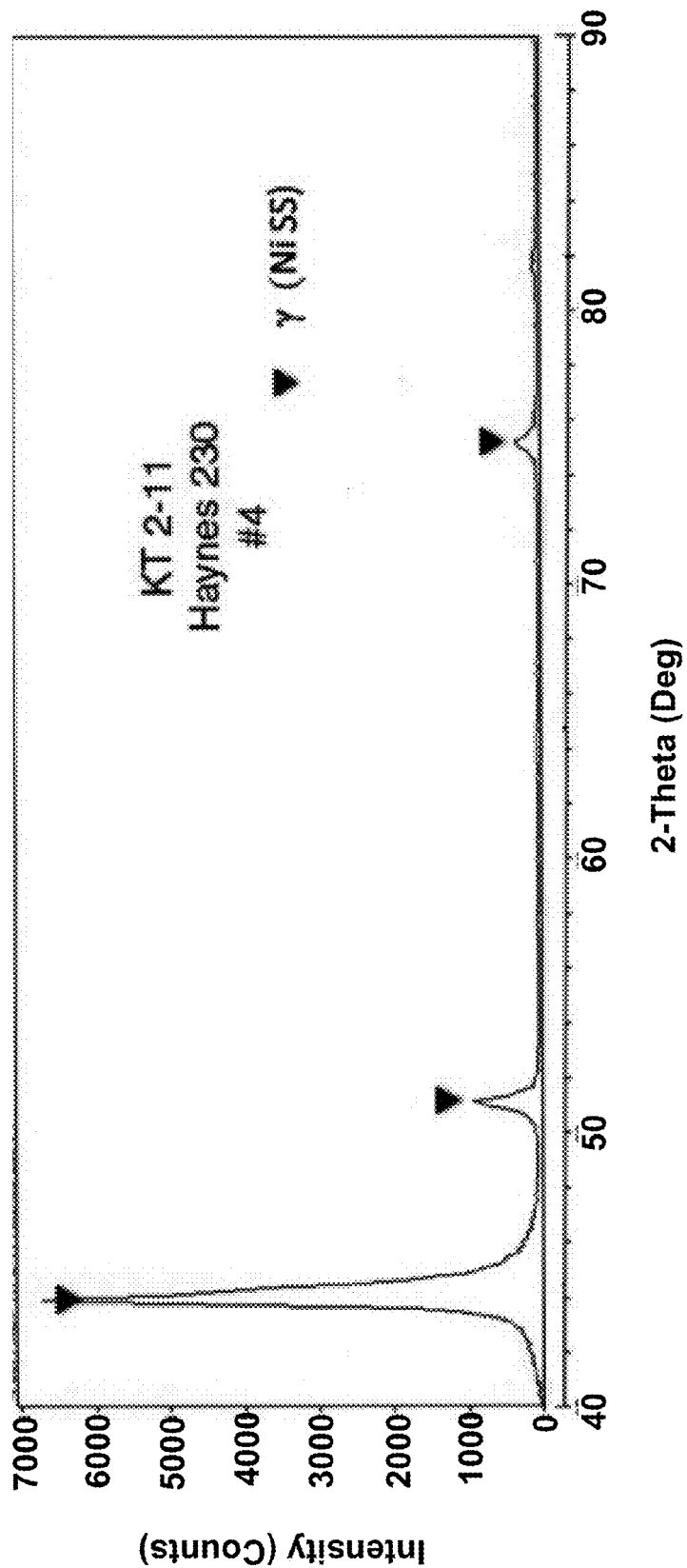
FIG. 4a illustrates an example of XRD spectra obtained from a nanocrystalline Ni-20Cr-7Al coating.
Figure 4B:
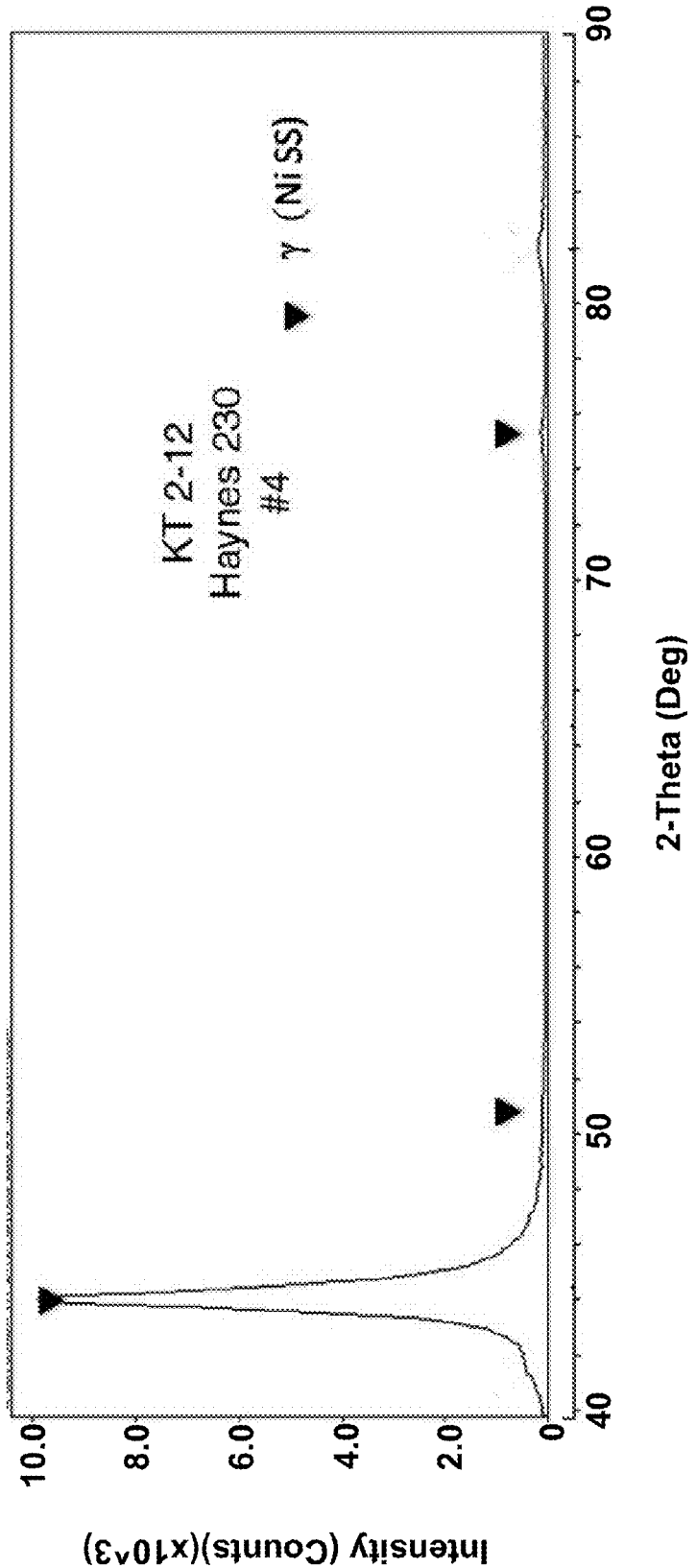
FIG. 4b illustrates an example of XRD spectra obtained from a nanocrystalline Ni-20Cr-10Al coating.

X-Ray diffraction (XRD) analysis was performed on the coatings to study the phase formation in the coatings. The microstructure of the coatings was essentially an Ni-rich solid solution (γ-phase) as illustrated in FIGS. 4a and 4b, wherein FIG. 4a illustrates the XRD analysis of the Ni-20Cr-7Al coating and FIG. 4b illustrates the XRD analysis of the Ni-20Cr-10Al coating. The grain size of each coating was calculated by using the width of the most intense Ni-rich phase peak of the XRD pattern. The grain size of the Ni-20Cr-7Al coating was 13.2 nm and the calculated grain size of the Ni-20Cr-10Al coating was 8.7 nm.

Figure 5:
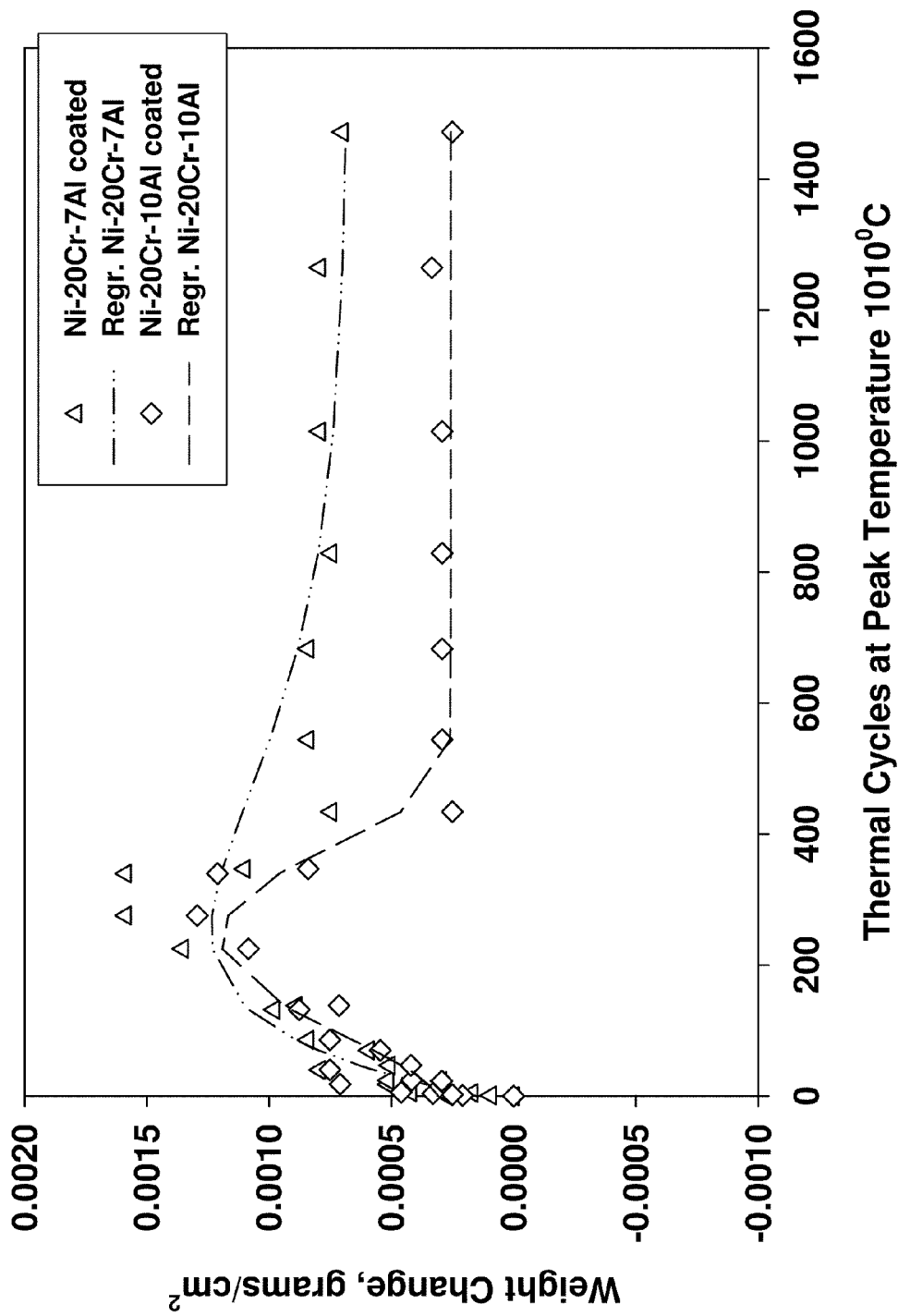
FIG. 5 illustrates a comparison of weight change during thermal cycling of an example of a nanocrystalline Ni-20Cr-7Al coating and a nanocrystalline Ni-20Cr-10Al coating.

Cyclic oxidation tests were performed on the Ni-20Cr-7Al and Ni-20Cr-10Al coatings deposited on the Haynes 230. The specimens were tested at peak temperatures of 1010° C. in a programmable, automated, bottom drop furnace. The specimens were maintained at 1010° C. in the furnace for 50 minutes and then removed and cooled via forced air for 10 minutes to room temperature. This cycle was repeated up to 1500 times for each alloy. Testing was interrupted to weigh the samples at various intervals. FIG. 5 illustrates the change in weight of the samples over the thermal cycling. As seen in the graph, the weight initially increased and then decreased; however, a net loss did not appear to occur during the testing period.

Figure 6:
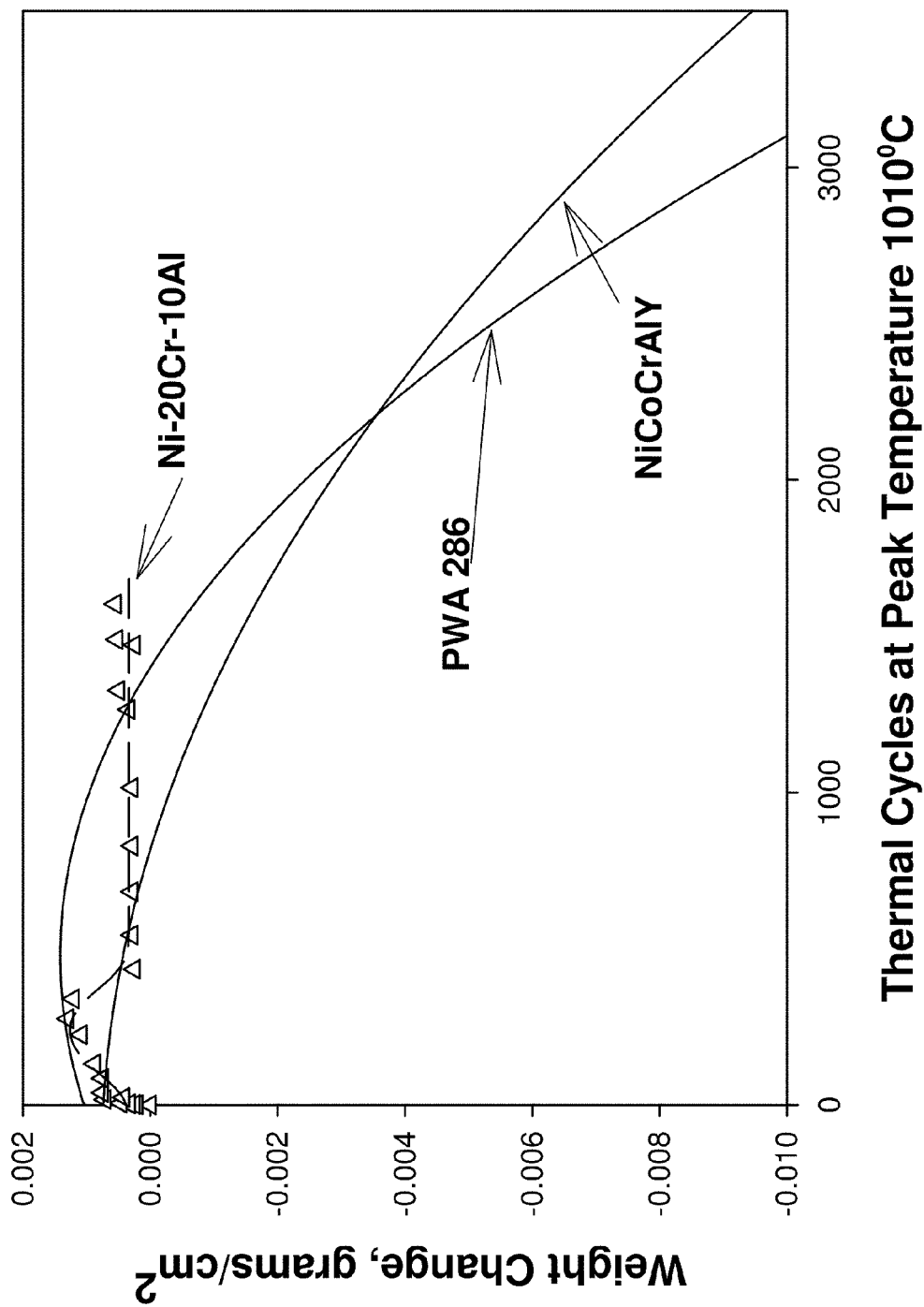
FIG. 6 illustrates a comparison of weight change during thermal cycling of an example of a nanocrystalline Ni-20Cr-10Al coating in view of an example of a conventional NiCoCrAlY coating and a conventional PWA 286 (NiCoCrAlYHfSi) coating.

The mass (weight) change results of the Ni-20Cr-10Al alloys are compared to those of conventional plasma sprayed NiCoCrAlY and NiCoCrAlYHfSi (PWA 286) coatings in FIG. 6, the chemical compositions of the NiCoCrAlY and NiCoCrAlYHfSi are illustrated in Table 2. As seen in FIG. 6, initial weight gain appears to be consistent across the coatings for approximately 250 cycles. After the weight gain, a relatively small weight loss was observed up to approximately 500 cycles and then the Ni-20Cr—Al coating weight appeared to stabilize up to 1470 cycles. This is apart from the NiCoCrAlY and NiCoCrAlYHfSi coatings wherein the weight loss continued below the initial weight of the tested samples. Weight loss is understood to be due to scale spallation with increasing thermal cycles.

TABLE 2

Chemical Compositions of the NiCoCrAlY and NiCoCrAlYHfSi (PWA 286) coatings.

| Element | NiCoCrAlY (wt %) | NiCoCrAlYHfSi (PWA 286) (wt %) |
|---|---|---|
| Aluminum | 8.2 | 12.5 |
| Cobalt | 37.9 | 20.0 |
| Chromium | 20.6 | 18.0 |
| Yttrium | 0.5 | 0.6 |
| Silicon | — | 0.4 |
| Hafnium | — | 0.25 |
| Nickel | Balance | Balance |

Figure 7A:
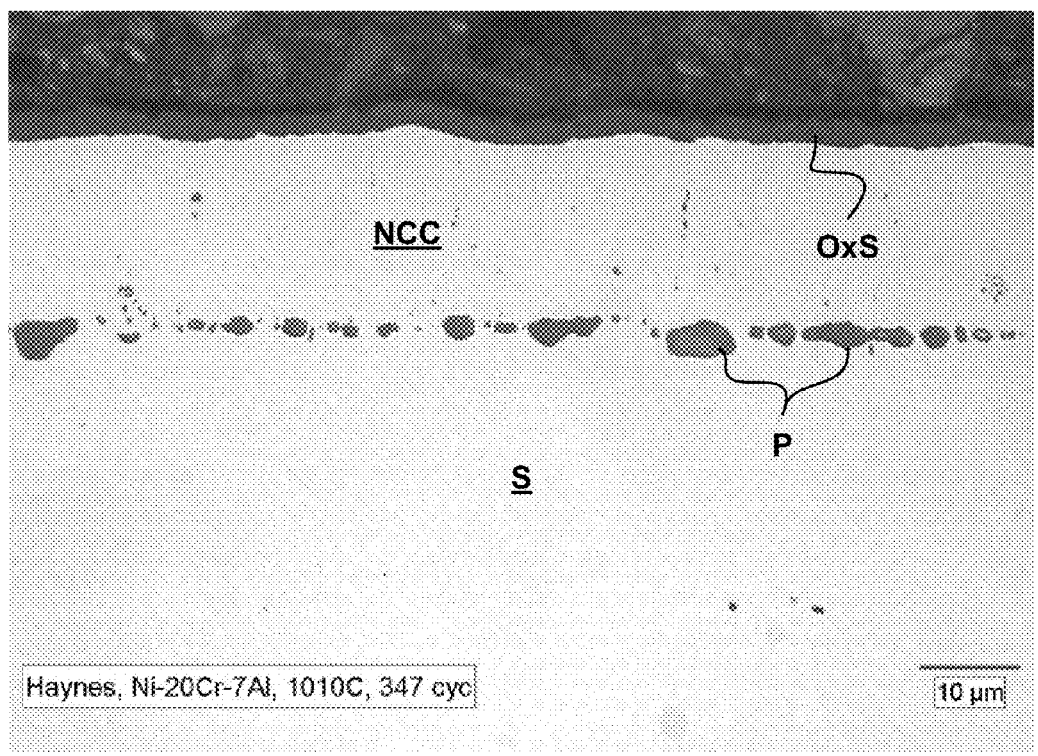
FIG. 7a illustrates an optical micrograph of an example of a nanocrystalline Ni-20Cr-7Al coating after 347 thermal cycles, wherein the scale at the bottom indicates 10 μm.
Figure 7B:
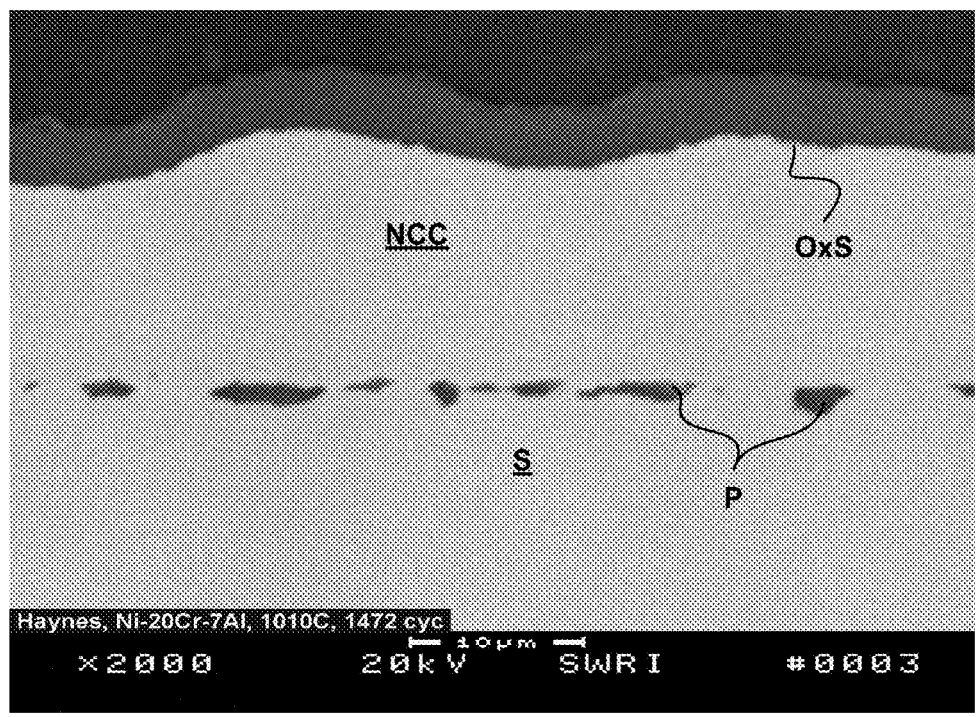
FIG. 7b illustrates an optical micrograph of an example of a nanocrystalline Ni-20Cr-7Al coating after 1472 thermal cycles, wherein the scale at the bottom indicates 10 μm.
Figure 8A:
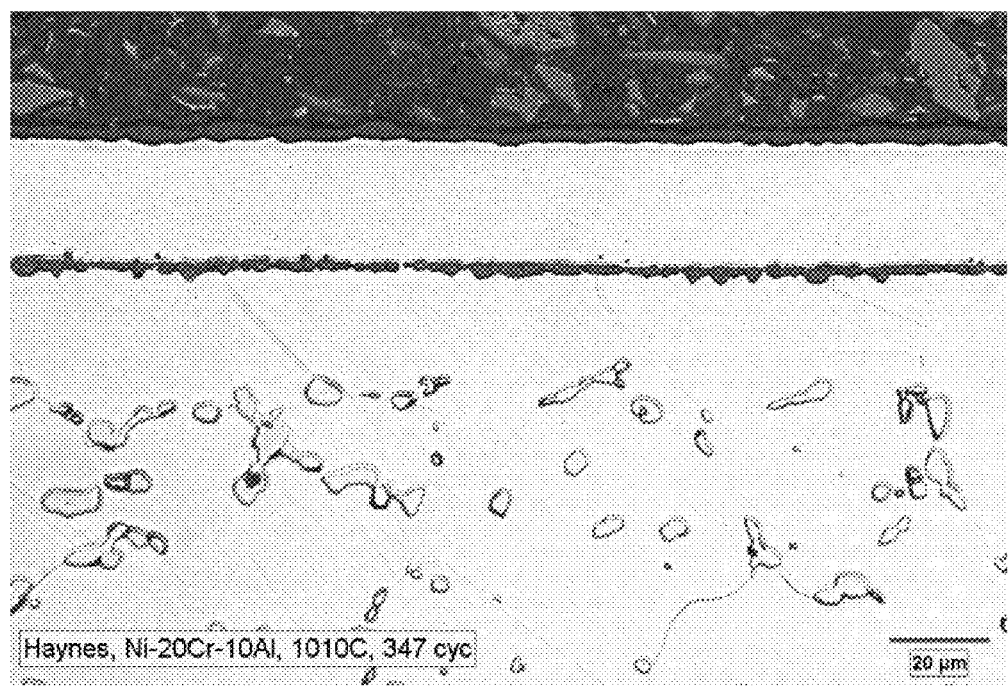
FIG. 8a illustrates an optical micrograph of an example of a nanocrystalline Ni-20Cr-10Al coating after 347 thermal cycles, wherein the scale at the bottom indicates 20 μm.
Figure 8B:
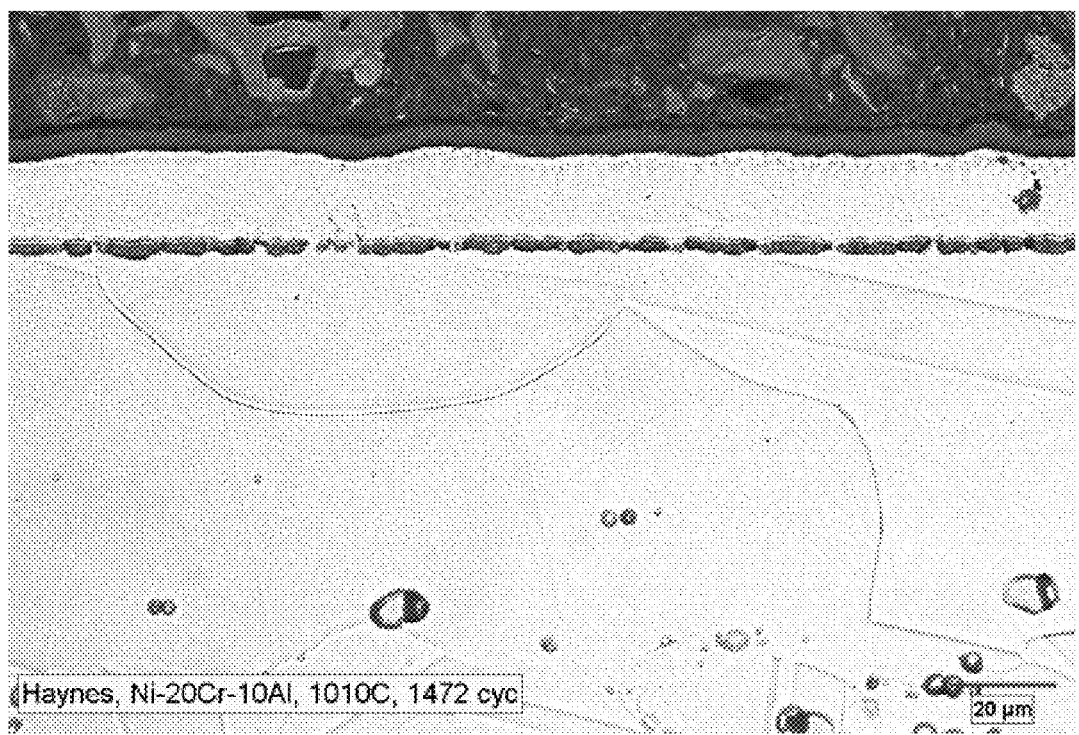
FIG. 8b illustrates an optical micrograph of an example of a nanocrystalline Ni-20Cr-10Al coating after 1472 thermal cycles, wherein the scale at the bottom indicates 20 μm.

After 346 cycles and 1472 cycles a transverse cross-section of the coatings was removed from the nanocrystalline coated samples during thermal cycling to study the microstructure and composition of the various layers. The compositions were determined via EDS. FIG. 7a illustrates the Ni-20Cr-7Al coating after 346 cycles and FIG. 7b illustrates the coating after 1472 cycles. FIG. 8a illustrates the Ni-20Cr-10Al coating after 346 cycles and FIG. 8b illustrates the coating after 1472 cycles.

Figure 9:
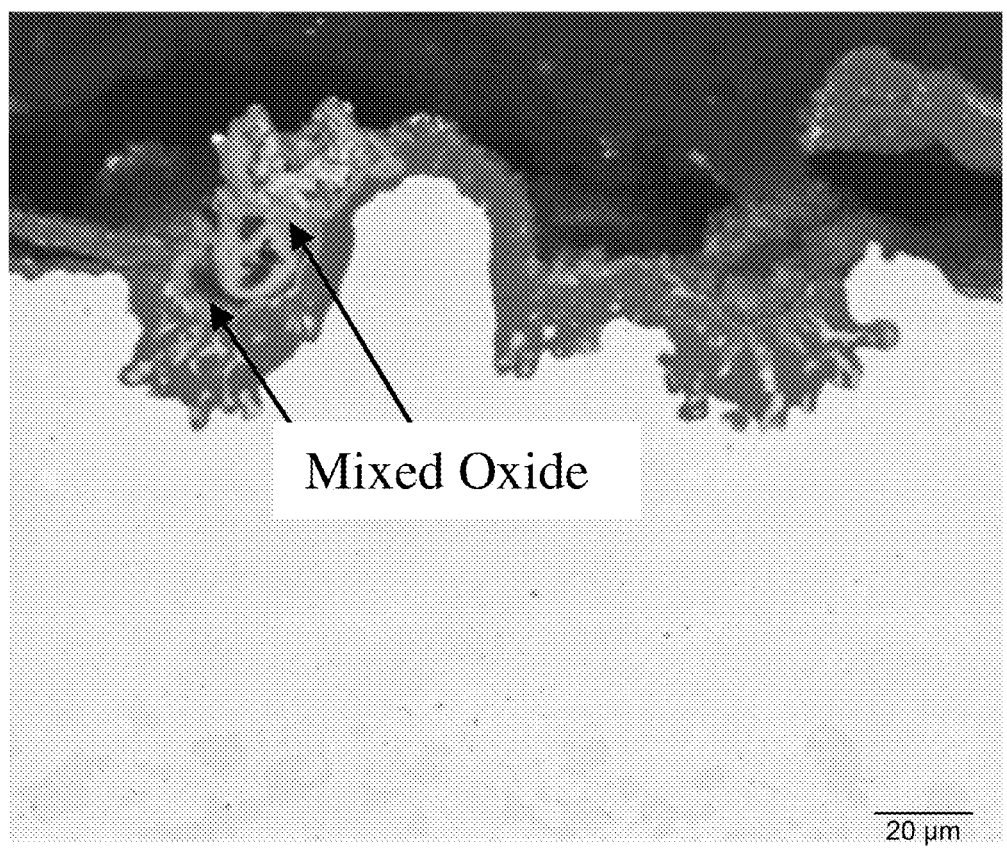
FIG. 9 illustrates a scanning electron microscope backscattered image of an example of oxide scale including mixed oxides formed from a NiCoCrAlY coating after exposure for 1500 cycles between room temperature and 1010° C. at 20 μm scale.

A relatively continuous, dense and uniform, crack free $Al_2O_3$ oxide scale (OxS) appeared to form on the nanocrystalline-coating. The scale appeared to be free of mixed oxides (i.e., NiO, $Cr_2O_3$ and spinels) whereas a mixed oxide scale was present on the plasma sprayed conventional NiCoCrAlY and NiCoCrAlYHfSi coatings. Mixed oxide scale of the NiCoCrAlY coating is illustrated in FIG. 9, which is believed to promote spallation.

Referring back to FIGS. 7a and 7b, coarse precipitates (P) were observed along the nanocrystalline coating (NCC)/substrate (S) interface, which were determined by EDS analysis to include Al-rich, Al—Cr—Ni, particles. The Al content among the interface precipitate particles was found to be as high as 87 wt %. After exposure (thermal cycling), the Al content in the Ni-20Cr-7Al coating dropped from 7 wt % to 0.8 wt % after 347 cycles and to 0.5 wt % after 1472 cycles. After thermal cycling, the Al content in the Ni-20Cr-10Al coating dropped from 10 wt % to 1.7 wt % after 347 cycles and to 0.7 wt % after 1472 cycles. Aluminum depletion was attributed to diffusion of aluminum through either surface of the coating and into the substrate or into the oxide scale. However, internal oxidation was not observed even though the aluminum content dropped as low as 0.5 wt %.

Figure 10:
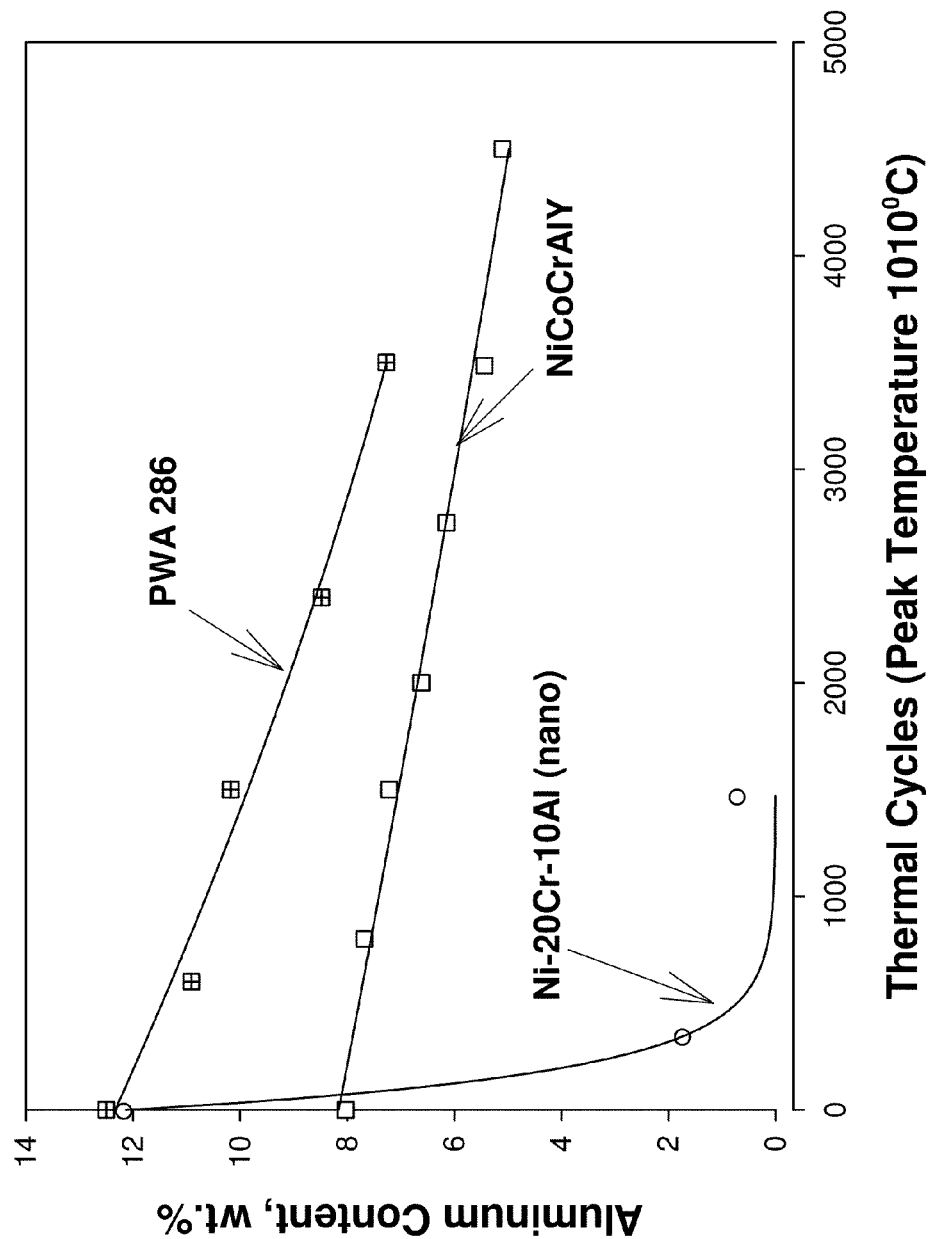
FIG. 10 illustrates a comparison of aluminum depletion in nanocrystalline Ni-20Cr-10Al and plasma sprayed NiCoCrAlY and PWA 286 (NiCoCrAlYHfSi) coatings during thermal cycling at peak temperatures of 1010° C.

FIG. 10 illustrates a comparison of the aluminum content of nanocrystalline Ni-20Cr-10Al (plasma enhanced magnetron sputtering) and the plasma sprayed NiCoCrAlY and NiCoCrAlYHfSi coatings. As can be seen in the figure, the aluminum consumption rate of the NiCoCrAlY and NiCoCrAlYHfSi coatings was relatively lower. However, a decrease in the critical value of Al in the coatings as between the nanocrystalline coatings and the conventional NiCoCrAlY and NiCoCrAlYHfSi coatings was identified. For example, a critical value of 3.7 wt % of Al is present in the NiCoCrAlY and NiCoCrAlYHfSi coatings where these coatings may exhibit localized oxidation. The nanocrystalline coatings were relatively free of oxidation at 0.5 wt % Al., suggesting the critical value of Al in these coatings is lower. It may therefore be appreciated that the usable aluminum ($Al_{usable}$) for diffusion into the coating and substrate is equal to the aluminum present in the coating ($Al_{coating}$) minus the critical value of aluminum ($Al_{critical}$). The critical value of aluminum may be understood as the minimum value of Al required to prevent internal oxidation and failure of the coating. In the present nanocrystalline coatings, the value of $Al_{critical}$ was found to be 0.5 wt %. As noted above, this is markedly lower than the critical value of 3.7 observed for the plasma sprayed NiCoCrAlY and NiCoCrAlYHfSi coatings where nanocrystalline morphology was not present. Accordingly, in the present disclosure, nanocrystalline coatings are provided wherein $Al_{usable}=Al_{coating}-0.5$ wt. %. Therefore, when the Al is present in the coatings herein at a level of 6.0 wt % to 12 wt % the value of Al usable is in the range of 5.5 wt % to 11.5 wt %.

Figure 11:
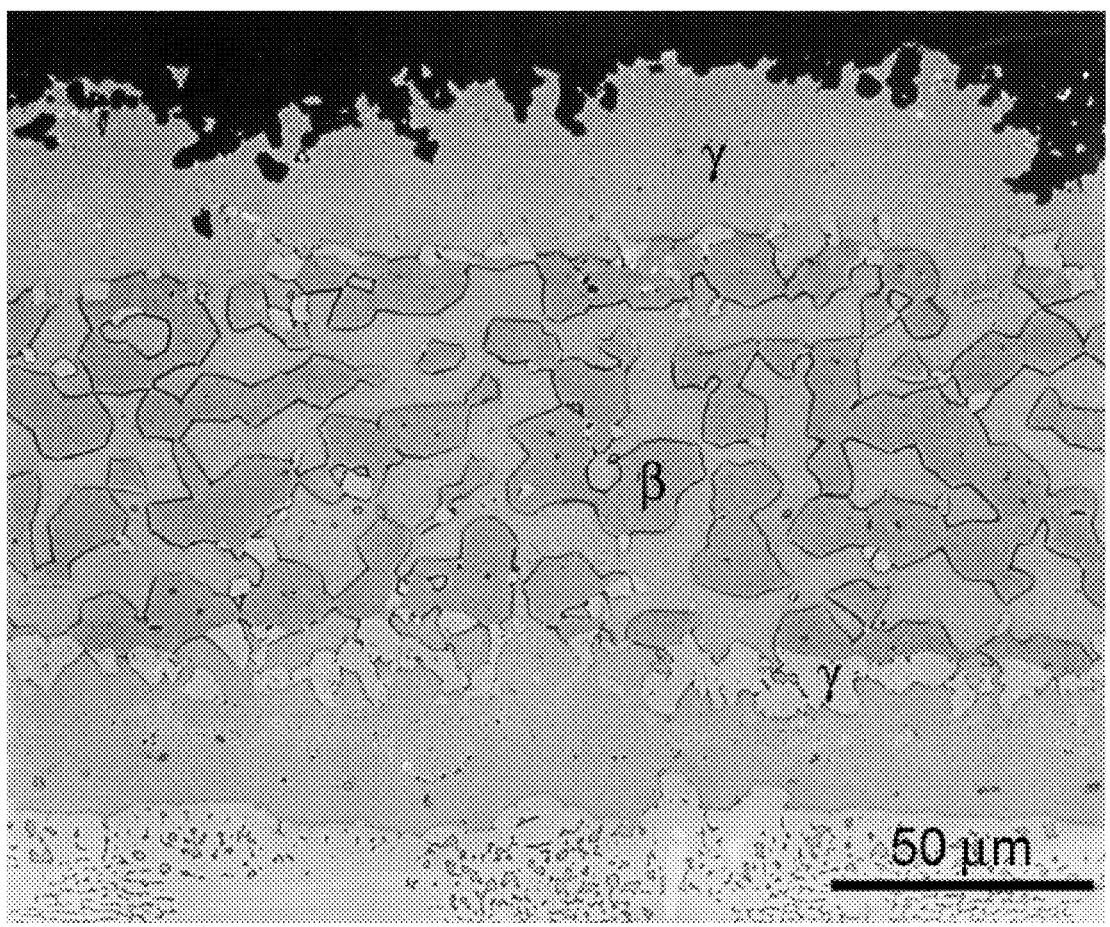
FIG. 11 illustrates localized oxidation in an example of a PWA 286 (NiCoCrAlYHfSi) coating after 1500 thermal cycles at peak temperatures of 1010° C., wherein the scale at the bottom indicates 50 μm.

FIG. 11 illustrates the effects of localized oxidation observed in a NiCoCrAlYHfSi coating after 1500 thermal cycles at a peak temperature of 1010° C. Again, FIG. 9 illustrates the effects of localized oxidation in NiCoCrAlY coatings.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method of forming an oxidation resistant nanocrystalline coating, comprising:
   depositing via plasma enhanced magnetron sputtering one or more diffusion barrier interlayers on a substrate in a vacuum chamber, wherein said diffusion barrier interlayers include nitride compositions, carbide compositions and/or combinations thereof, wherein said nitride compositions and said carbide compositions include a metal or metalloid selected from one or more of the following: Zr, Ta, W, and Si;
   depositing via plasma enhanced magnetron sputtering an oxidation resistant coating comprising an MCrAl(Y) alloy on said substrate in said vacuum chamber, wherein M includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium is optionally present in the range of 0.1 wt % to 0.5 wt % of the MCrAl(Y) alloy, at a gas pressure of 1 mTorr to 10 mTorr and said coating exhibits a grain size of 5 nm to 20 nm as deposited,
   wherein during plasma enhanced magnetron sputtering a gas is supplied to said vacuum chamber and said gas is ionized with electrons discharged from an electron source and injected into said vacuum chamber.

2. The method of claim 1, wherein silicon is present in the oxidation resistant coating in the range of 0.1 wt % to 1.0 wt %.

3. The method of claim 1, wherein hafnium is present in the oxidation resistant coating in the range of 0.1 wt % to 1.0 wt %.

4. The method of claim 1, wherein said MCrAl(Y) alloy comprises chromium present in the range of 15 wt % to 25 wt % of the MCrAl(Y) alloy, aluminum present in the range of 6 wt % to 12 wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is nickel.

5. The method of claim 1, wherein said MCrAl(Y) alloy comprises chromium present in the range of 15 wt % to 25 wt % of the MCrAl(Y) alloy, cobalt present in the range of 20.0 wt % to 40.0 wt % of the MCrAl(Y) alloy, aluminum present in the range of 6 wt % to 12wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is nickel.

6. The method of claim 1, wherein said MCrAl(Y) alloy comprises chromium present in the range of 20 wt % to 30wt % of the MCrAl(Y) alloy, aluminum present in the range of 6 wt % to 12 wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is cobalt.

7. The method of claim 1 wherein said coating includes a surface and exhibits a usable aluminum content ($Al_{usable}$) for diffusing into said substrate or to said coating surface, and wherein said usable aluminum content is equal to 5.5 wt % to 11.5 wt %.

8. The method of claim 1 wherein said coating exhibits an overall increase in weight of 0.000 grams/cm$^2$ to 0.0010 grams/cm$^2$ over an initial weight value when thermally cycled to peak temperatures of 1010° C. for 50 minutes per cycle and cooled to room temperature in 10 minutes per cycle over 1500 cycles.

9. A method of forming an oxidation resistant nanocrystalline coating, comprising:
   depositing via plasma enhanced magnetron sputtering one or more diffusion barrier interlayers on a substrate in a vacuum chamber, wherein said diffusion barrier interlayers include nitride compositions, carbide compositions and/or combinations thereof, wherein said nitride compositions and said carbide compositions include a metal or metalloid selected from one or more of the following: Zr, Ta, W, and Si;
   depositing via plasma enhanced magnetron sputtering an oxidation resistant coating comprising an MCrAl(Y) alloy on said substrate in said vacuum chamber, wherein M includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium is optionally present in the range of 0.1 wt % to 0.5 wt % of the MCrAl(Y) alloy at a gas pressure of 1 mTorr to 10 mTorr and said coating exhibits a grain size of 5 nm to 20 nm as deposited;

wherein during plasma enhanced magnetron sputtering a gas is supplied to said vacuum chamber and said gas is ionized with electrons discharged from an electron source and injected into said vacuum chamber and wherein said coating includes a surface and exhibits a usable aluminum content ($Al_{usable}$) for diffusing into said substrate or to said coating surface, and wherein said usable aluminum content is equal to 5.5 wt % to 11.5 wt %; and wherein said coating exhibits an overall increase in weight of 0.000 grams/cm$^2$ to 0.0010 grams/cm$^2$ over an initial weight value when thermally cycled to peak temperatures of 1010° C. for 50 minutes per cycle and cooled to room temperature in 10 minutes per cycle over 1500 cycles.

10. An oxidation resistant nanocrystalline coating, comprising:

an MCrAl(Y) alloy, wherein M includes iron, nickel, cobalt, or combinations thereof present greater than 50 wt % of the MCrAl(Y) alloy, chromium is present in the range of 15 wt % to 30 wt % of the MCrAl(Y) alloy, aluminum is present in the range of 6 wt % to 12 wt % of the MCrAl(Y) alloy and yttrium is optionally present in the range of 0.1 wt % to 0.5 wt % of the MCrAl(Y) alloy and said coating exhibits a grain size of 5 nm to 20 nm as deposited on a substrate; and a diffusion barrier interlayer deposited between said MCrAl(Y) alloy and said substrate, wherein said diffusion barrier interlayer include nitride compositions, carbide compositions and/or combinations thereof and said nitride compositions and said carbide compositions include a metal or metalloid selected from one or more of the following: Zr, Ta, W, and Si.

11. The oxidation resistant nanocrystalline coating of claim 10, wherein silicon is present in the oxidation resistant coating in the range of 0.1 wt % to 1.0 wt %.

12. The oxidation resistant nanocrystalline coating of claim 10, wherein hafnium is present in the oxidation resistant coating in the range of 0.1 wt % to 1.0 wt %.

13. The oxidation resistant nanocrystalline coating of claim 10, wherein said MCrAl(Y) alloy comprises chromium present in the range of 15 wt % to 25 wt % of the MCrAl(Y) alloy, aluminum present in the range of 6 wt % to 12 wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is nickel.

14. The oxidation resistant nanocrystalline coating of claim 10, wherein said MCrAl(Y) alloy comprises chromium present in the range of 15 wt % to 25 wt % of the MCrAl(Y) alloy, cobalt present in the range of 20.0 wt % to 40.0 wt % of the MCrAl(Y) alloy, aluminum present in the range of 6 wt % to 12 wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is nickel.

15. The oxidation resistant nanocrystalline coating of claim 10, wherein said MCrAl(Y) alloy comprises chromium present in the range of 20 wt % to 30 wt % of the MCrAl(Y) alloy, aluminum present in the range of 6 wt % to 12 wt % of the MCrAl(Y) alloy, yttrium optionally present in the range of 0.1 wt % to 0.5 wt % of the MCrAl(Y) alloy, silicon optionally present in the range of 0.1 wt % to 0.5 wt % of the MCrAl(Y) alloy, hafnium optionally present in the range of 0.1 wt % to 1.0 wt % of the MCrAl(Y) alloy and the balance is cobalt.

16. The oxidation resistant nanocrystalline coating of claim 10, further comprising a thermal barrier coating.

17. The oxidation resistant nanocrystalline coating of claim 10, wherein said coating has a thickness of 10 μm to 50 μm.

18. The oxidation resistant nanocrystalline coating of claim 10, wherein said coating includes a surface and exhibits a usable aluminum content ($Al_{usable}$) for diffusing into said substrate or to said coating surface, and wherein said usable aluminum content is equal to 5.5 wt % to 11.5 wt %.

19. The oxidation resistant nanocrystalline coating of claim 10, wherein said coating exhibits an overall increase in weight of 0.000 grams/cm$^2$ to 0.0010 grams/cm$^2$ over an initial weight value when thermally cycled to peak temperatures of 1010° C. for 50 minutes per cycle and cooled to room temperature in 10 minutes per cycle over 1500 cycles.

* * * * *

UNITED STATES PATENT AND TRADEMARK OFFICE
CERTIFICATE OF CORRECTION

PATENT NO. : 8,790,791 B2
APPLICATION NO. : 12/760864
DATED : July 29, 2014
INVENTOR(S) : Narayana S. Cheruvu et al.

It is certified that error appears in the above-identified patent and that said Letters Patent is hereby corrected as shown below:

On the Title Page, item (54) and in the Specification, column 1, line 1, delete "OXIDATION RESISTANT NANOCRYSTALLINE MCRAL(Y) COATINGS AND METHODS OF FORMING SUCH COATINGS", and insert -- OXIDATION RESISTANT NANOCRYSTALLINE MCrAl(Y) COATINGS AND METHODS OF FORMING SUCH COATINGS --, therefor.

Signed and Sealed this
Thirtieth Day of September, 2014

Michelle K. Lee
*Deputy Director of the United States Patent and Trademark Office*